(12) United States Patent
Ishii et al.

(10) Patent No.: US 8,603,380 B2
(45) Date of Patent: Dec. 10, 2013

(54) STAMPER FOR TRANSFERRING FINE PATTERN AND METHOD FOR MANUFACTURING THEREOF

(75) Inventors: Satoshi Ishii, Hitachi (JP); Masahiko Ogino, Hitachi (JP); Noritake Shizawa, Ninomiya (JP); Kyoichi Mori, Oiso (JP); Akihiro Miyauchi, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/603,455

(22) Filed: Sep. 5, 2012

(65) Prior Publication Data
US 2013/0001835 A1   Jan. 3, 2013

Related U.S. Application Data

(62) Division of application No. 12/635,730, filed on Dec. 11, 2009, now abandoned.

(30) Foreign Application Priority Data

Dec. 11, 2008 (JP) ................................. 2008-315142

(51) Int. Cl.
*B29C 35/00* (2006.01)

(52) U.S. Cl.
USPC .......................... 264/293; 264/319; 425/385

(58) Field of Classification Search
USPC ................... 264/293, 319; 425/385
See application file for complete search history.

(56) References Cited

U.S. PATENT DOCUMENTS

| 7,195,733 B2 | 3/2007 | Rogers et al. | |
| 2003/0113638 A1* | 6/2003 | Mancini et al. | 430/5 |
| 2005/0238967 A1* | 10/2005 | Rogers et al. | 430/5 |
| 2009/0163652 A1 | 6/2009 | Tajima et al. | |
| 2009/0176015 A1 | 7/2009 | Nakanishi et al. | |
| 2009/0256287 A1 | 10/2009 | Fu et al. | |
| 2013/0052583 A1* | 2/2013 | Keszler et al. | 430/270.1 |

FOREIGN PATENT DOCUMENTS

| JP | 2004-351693 A | 12/2004 |
| JP | 2008-507114 | 3/2008 |
| JP | 2008-246876 | 10/2008 |
| JP | 2008-266608 | 11/2008 |

OTHER PUBLICATIONS

JP Office Action of Appln. No. 2008-315142 dated Jun. 19, 2012.
Pil Yoo et al., Unconventional Patterning with a Modulus-Tunable Mold: From Imprinting to Microcontact Printing, Chem. Material, 2004, pp. 5000-5005.
H. Schmid et al., Siloxane Polymers for High-Resolution, High-Accuracy Soft Lithography, Macromolecules 2000, 33, pp. 3042-3049.

* cited by examiner

*Primary Examiner* — James Sanders
(74) *Attorney, Agent, or Firm* — Antonelli, Terry, Stout & Kraus, LLP.

(57) ABSTRACT

An object of the present invention is to provide a stamper for transferring fine pattern and a method for manufacturing the stamper, the stamper has a fine structure layer to improve a continuous transferring property of the resinous stamper, and to allow accurate and continuous transferring. In order to achieve the above object, the present invention provides a stamper for transferring fine pattern, including: a fine structure layer on a supporting substrate, in which the fine structure layer is a polymer of a resinous compound whose principal component is silsesquioxane derivative having a plurality of polymerizable functional groups.

8 Claims, 2 Drawing Sheets

STAMPER FOR TRANSFERRING FINE PATTERN AND METHOD FOR MANUFACTURING THEREOF

CROSS-REFERENCE TO RELATED APPLICATION

This application is a divisional application of U.S. application Ser. No. 12/635,730, filed Dec. 11, 2009 now abandoned, the contents of which are incorporated herein by reference.

CROSS REFERENCE TO RELATED APPLICATIONS

The present application claims benefit of the filing date of Japanese Patent Application No. 2008-315142 filed on Dec. 11, 2008 which is incorporated herein by reference.

FIELD OF THE INVENTION

The present invention relates to a stamper for transferring a fine pattern on a surface of a transferred object by pressing the stamper against the surface, and to a method for manufacturing the stamper.

DESCRIPTION OF THE RELATED ART

Conventionally, a photolithography technology is frequently used as the technology for processing a fine pattern needed in semiconductor devices, etc. Because, however, the pattern has been shrunk and a required process dimension has been shrunk as small as a light source wave length which is used for an exposure, it becomes difficult to process the fine pattern by the photolithography technology. For this reason, instead of the photolithography technology, an electron beam lithography apparatus which is a kind of a charged particle beam apparatus has been used.

A pattern formation method of the electron beam lithography apparatus is a direct drawing method of a mask pattern, which is different from a pattern formation method of a one-shot exposure method using a light source such as i-line and an excimer laser. Therefore, there is a disadvantage that an exposure time (drawing time) increases as a number of patterns to be drawn increases. Accordingly, a long time is required for completing the patterns. As a result, in proportion to a degree of integration of a semiconductor integrated circuit, a time required for the pattern formation increases, thereby resulting in reduction of a throughput.

Then, for speeding up the electron beam lithography apparatus, a technology of one-shot drawing radiation method is developing, in which method various shapes of masks are combined and the electron beam is irradiated in one-shot, thereby resulting in a complex-shaped beam. However, because a degree of requirement for fine pattern has progressed, there are many factors which raise a fabrication cost, for example, growing in size of the electron beam apparatus and increase in accuracy of mask alignment.

In contradistinction to the above, a nanoimprint technology is well known as a technology for forming a fine pattern at low cost. In this nanoimprint technology, the fine pattern can be formed on a resinous layer of a transferred object by pressing the stamper having a concavity and convexity (a surface configuration) corresponding to a concavity and convexity of a pattern to be formed against, for example, a transferred object obtained by forming a resinous layer on a predetermined substrate. Also, this nanoimprint technology is considered to apply to formation of a memory bit in a large volume storage medium, and pattern formation in a semiconductor integrated circuit.

At present, a hard stamper (e.g., quartz, etc.) used in a prior art nanoimprint technology has a disadvantage that the hard stamper can not follow warps and projections of the transferred substrate at the time of transferring, thereby resulting in widespread transferring failure regions. In order to reduce the transferring failure regions, it is necessary to absorb both of warps and projections of the substrate. For this reason, a soft resinous stamper which follows both of warps and projections of the substrate is considered (see Hong H. Lee, Chem. Mater., vol. 16, p. 5000 (2004)). Further, a multi-layer type resinous stamper having a flexible resinous layer called a buffer layer between a substrate and a fine structure layer is reported (see B. Michel et al., Macromolecules, vol. 33, p. 3042 (2000)). Also, in the nanoimprint technology, because peeling of the transferred object from the fine structure layer has a considerable influence on a transferring accuracy, mold releasing properties of both of the transferred object and the fine structure layer are important. Conventionally, the stamper (e.g., quartz, etc.) used in the nanoimprint is given the mold releasing property by treating its surface with a fluorinated mold release agent (see JP 2004-351693 A). At present, a surface of a soft stamper is likewise releasing-treated to be used for transferring.

However, in the prior art stamper, accuracy in the pattern tends to decrease owing to uneven thickness of the applied mold release agent, and the transferring failure occurs owing to degradation of a mold releasing layer caused by repeated transferring.

Therefore, an object of the present invention is to provide a stamper for transferring fine pattern and a method for manufacturing the stamper, the stamper has a fine structure layer to improve a continuous transferring property of the resinous stamper, and to allow accurate and continuous transferring.

SUMMARY OF THE INVENTION

In order to achieve the above object, the present invention provides a stamper for transferring fine pattern, including: a fine structure layer on a supporting substrate, in which the fine structure layer is a polymer of a resinous compound whose principal component is silsesquioxane derivative having a plurality of polymerizable functional groups.

Also, in order to achieve the above object, the present invention provides a method for manufacturing the stamper for transferring fine pattern, including the steps of: applying a resinous compound whose principal component is silsesquioxane derivative having a plurality of polymerizable functional groups on a supporting substrate; pressing a master mold on which a fine pattern is formed against the resinous compound applied on the supporting substrate; curing the resinous compound with the master mold being pressed; and peeling the master mold from the cured resinous compound.

DETAILED DESCRIPTION OF THE INVENTION

Figure 1A:
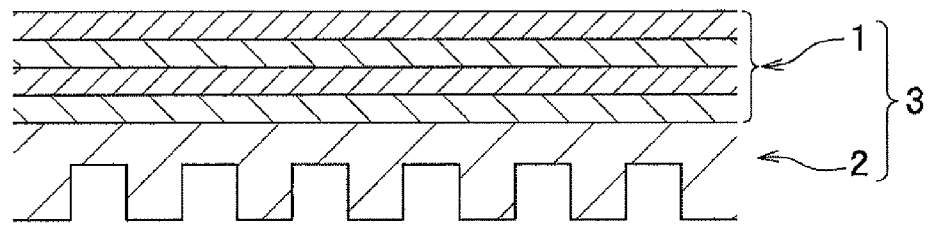
FIG. 1A is a schematic view showing a stamper for transferring a fine pattern of an embodiment according to the present invention.
Figure 1B:
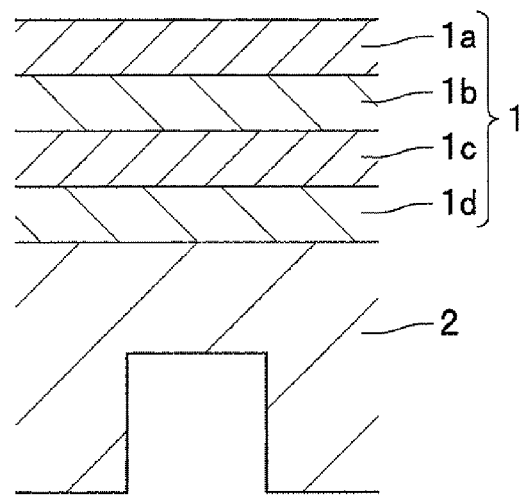
FIG. 1B is a partial enlarged view showing a supporting substrate of the stamper shown in FIG. 1A.
Figure 1C:
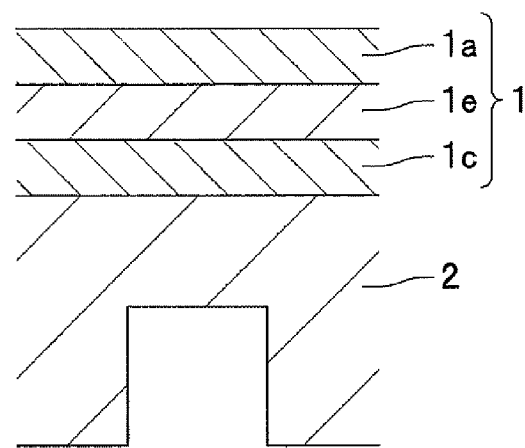
FIG. 1C is a partial enlarged view showing a modified embodiment of the supporting substrate shown in FIG. 1B.

Next, with reference to FIGS. 1-3, embodiments according to the present invention will be explained in detail. FIG. 1A is a schematic view showing a stamper for transferring a fine pattern of an embodiment according to the present invention, FIG. 1B is a partial enlarged view showing a supporting substrate of the stamper shown in FIG. 1A, and FIG. 1C is a partial enlarged view showing a modified embodiment of the supporting substrate shown in FIG. 1B.

As shown in FIG. 1A, the stamper 3 according to this embodiment has a fine structure layer 2 on a supporting substrate 1. Here, the term "fine structure" means a structure which is formed on the order of nanometer or micrometer units.

The supporting substrate 1 is not limited in material, size, and method for manufacturing as long as the supporting substrate 1 has a function to support the fine structure layer 2. For example, the supporting substrate 1 may be made of materials having strength and workability such as a silicon wafer, various metallic materials, a glass, a quartz, ceramics, and a resin, etc. More specifically, Si, SiC, SiN, polycrystalline Si, Ni, Cr, Cu, and a material including one or more of Si, SiC, SiN, polycrystalline Si, Ni, Cr, and Cu are shown as examples. Especially, it is preferable that the fine structure layer 2 and the buffer layer (not shown) which may be disposed between the fine structure layer 2 and the supporting substrate 1 are made of a photo-curable material because the quartz and the glass are highly transparent and light is irradiated into the resin efficiently.

Also, for example, phenol-formaldehyde resin (PF), urea-formaldehyde resin (UF), melamine-formaldehyde resin (MF), polyethylene terephthalate (PET), unsaturated polyester resin (UP), alkyd resin, vinylester resin, epoxy resin (EP), polyimide resin (PI), polyurethane (PUR), polycarbonate (PC), polystyrene (PS), acrylic resin (PMMA), polyamide resin (PA), ABS resin, AS resin, AAS resin, polyvinyl alcohol, polyethylene (PE), polypropylene (PP), polytetrafluoroethylene (PTFE), polyarylate resin, cellulose acetate, polypropylene, polyethylene naphthalate (PEN), polybutylene terephthalate (PBT), polyphenylene sulfide (PPS), polyphenylene oxide, cycloolefin polymer, polylactic resin, silicone resin, and diallyl phthalate resin, etc. are given as examples of the resin. These resins, either individually or in combination, may be used. Also, these resins may include a filler such as an inorganic filler, and an organic filler, etc.

Also, the supporting substrate 1 may have a flexible resinous layer called a buffer layer (not shown) between the supporting substrate 1 and the fine structure layer 2. Also, in order to strengthen adhesion between the fine structure layer 2 and the buffer layer, a surface of the buffer layer may be coupling-treated.

The supporting substrate 1 may be made of a single or a plurality of materials.

The supporting substrate 1 shown in FIG. 1B includes a first hard layer 1a, a first soft layer 1b, a second hard layer 1c, and a second soft layer 1d in order of the above description. Also, elastic coefficients of the first soft layer 1b and the second soft layer 1d are less than those of the first hard layer 1a and the second hard layer 1c. Incidentally, the fine structure layer 2 is formed on a surface of the second soft layer 1d. Each of the first soft layer 1b, the second soft layer 1d, the first hard layer 1a, and the second hard layer 1c can be made of materials selected from the above described materials so as to keep the relation among the above described elastic coefficients.

Also, the supporting substrate 1 may have another configuration which is composed of two or more kinds of layers whose elastic coefficients differ one another. The supporting substrate 1 shown in FIG. 1C includes the first hard layer 1a, a soft layer 1e, and the second hard layer 1c in order of the above description, and an elastic coefficient of the soft layer 1e is less than those of the first hard layer 1a and the second hard layer 1c.

In addition, the supporting substrate 1 according to the present invention is not limited in the order and combination of the hard layers and the soft layers, and the layer at which the fine structure layer 2 is disposed. That is, the supporting substrate 1 is not limited to the number of layers, the order of layers, and configuration.

The fine structure layer 2 is made of a polymer (cured material) of a resinous compound whose principal component is silsesquioxane derivative having a plurality of polymerizable functional groups. The silsesquioxane derivative content in the resinous compound is preferably 80 weight percent or more.

The silsesquioxane derivative (monomer) has preferably three or more polymerizable functional groups.

The polymerizable functional group is preferably at least one selected from a vinyl group, an epoxy group, an oxetanyl group, a vinyl ether group, and a (metha)acrylate group.

In such a silsesquioxane derivative, a curing mechanism of a curable resinous material selected by a method described below for transferring using the stamper for transferring a fine pattern of the present invention preferably differs from that of the silsesquioxane derivative. More specifically, if the curable resinous material for transferring is a radical polymerizable material, a photo-cationic polymerizable silsesquioxane derivative is preferred. On the contrary, if the curable resinous material for transferring is a photo-cationic polymerizable material, a photo-radical polymerizable silsesquioxane derivative is preferred.

The resinous compound, of which the fine structure layer 2 is composed, may include other cured resin than the silsesquioxane derivative as a principal component.

As the other cured resin, a resinous monomer which is cured by the same mechanism as that of the polymerizable functional group included in the silsesquioxane derivative is desired.

As the other cured resin having the epoxy group, for example, a bisphenol A epoxy resin, a hydrobisphenol A epoxy resin, a bisphenol F epoxy resin, a novolac-type epoxy resin, an alicyclic epoxy resin, a naphthalene-type epoxy resin, a biphenyl-type epoxy resin, and bifunctional alcohol ether-type epoxy resin, etc. are given.

As the other cured resin having the oxetanyl group, for example, 3-ethyl-3-hydroxymethyloxetane, 1,4-bis[(3-ethyl-3-oxetanylmethoxy)methyl]benzene, 3-ethyl-3-(phenoxymethyl)oxetane, di[1-ethyl(3-oxetanyl)]methylether, 3-ethyl-3-(2-ethylhexyloxymethyl)oxetane, 3-ethyl-3-{[3-(triethoxysilyl)propoxy]methyl}oxetane, oxetanyl silsesquioxane, phenol novolac oxetane, etc. are given.

As the other cured resin having the vinyl ether group, for example, ethylene glycol divinylether, diethylene glycol divinylether, triethylene glycol divinylether, tetraethylene glycol divinylether, butanedioldivinylether, hexanedioldivinylether, cyclohexanedimethanoldivinylether, isophthalic acid di(4-vinyloxy) butyl, glutaric acid di(4-vinyloxy)butyl, succinic acid di(4-vinyloxy) butyl trimethylol propane trivinyl ether, 2-hydroxyethylvinylether, hydroxybutylvinylether, hydroxyhexylvinylether, etc. are given.

While organic components having any one functional group of the epoxy group, the oxetanyl group, and the vinyl ether group were provided above, the present invention is not limited to the organic components. Any organic component having a polymerizable functional group such as the epoxy group, the oxetanyl group, and the vinyl ether group, etc. in the organic component's chain can be basically used for the present invention.

Also, the resinous compound, of which the fine structure layer 2 is composed, preferably further includes a photo-curing polymerization initiator.

This photo-curing polymerization initiator is appropriately selected depending on the silsesquioxane derivative included in the resinous compound and the polymerizable functional group included in the other cured resin. Especially, the cationic polymerization initiator is desirable because the cationic polymerization initiator prevents bad curing caused by oxygen inhibition.

The cationic polymerization initiator is not limited as long as the cationic polymerization initiator is an electrophilic reagent, has a cation source, and cures the organic component by heat or light. Well known cationic polymerization initiator may be used. Especially, a cationic polymerizable catalyst which initiates curing by ultraviolet light is desirable because the cationic polymerizable catalyst allows concavity and convexity pattern formation at room temperature, and allows replica formation from a master mold with high precision.

As the cationic polymerizable catalyst, for example, an iron-allene complex compound, an aromatic diazonium salt, an aromatic iodonium salt, an aromatic sulfonium salt, a pyridinium salt, an aluminum complex/silylether, a proton acid, and Lewis acid, etc. are given.

Also, as concrete examples of cationic polymerization catalysts which initiate curing by ultraviolet light, IRGACURE261 (Ciba-Geigy Ltd.), OPTOMER SP-150 (Asahi Denka Corporation), OPTOMER SP-151 (Asahi Denka Corporation), OPTOMER SP-152 (Asahi Denka Corporation), OPTOMER SP-170 (Asahi Denka Corporation), OPTOMER SP-171 (Asahi Denka Corporation), OPTOMER SP-172 (Asahi Denka Corporation), UVE-1014 (General Electric Company), CD-1012 (Sartomer Co., Inc.), SAN-AID SI-60L (Sanshin Chemical Industry Co., Ltd.), SAN-AID SI-80L (Sanshin Chemical Industry Co., Ltd.), SAN-AID SI-100L (Sanshin Chemical Industry Co., Ltd.), SAN-AID SI-110 (Sanshin Chemical Industry Co., Ltd.), SAN-AID SI-180 (Sanshin Chemical Industry Co., Ltd.), CI-2064 (Nippon Soda Co., Ltd.), CI-2639 (Nippon Soda Co., Ltd.), CI-2624 (Nippon Soda Co., Ltd.), CI-2481 (Nippon Soda Co., Ltd.), UVACURE 1590 (Daicel-Cytec Company, Ltd.), UVACURE 1591 (Daicel-Cytec Company, Ltd.) RHODORSIL Photo Initiator 2074 (Rhone-Poulenc), UVI-6990 (Union Carbide Corporation), BBI-103 (Midori Kagaku Co., Ltd.), MPI-103 (Midori Kagaku Co., Ltd.), TPS-103 (Midori Kagaku Co., Ltd.), MDS-103 (Midori Kagaku Co., Ltd.), DTS-103 (Midori Kagaku Co., Ltd.), DTS-103 (Midori Kagaku Co., Ltd.), NAT-103 (Midori Kagaku Co., Ltd.), NDS-103 (Midori Kagaku Co., Ltd.), CYRAURE UVI6990 (Union Carbide Japan Corporation), etc. are given. These polymerization initiators, either individually or in combination, may be used. Also, these polymerization initiators may be applied in combination with well known polymerization accelerator and sensitizer, etc.

It is desirable that all of the components of such a resinous compound, except the photo-curing polymerization initiator, are resins having the polymerizable functional groups.

However, if a solvent component having no reactive functional group, which solvent is unintentionally mixed in a manufacturing process, is included in the resinous compound, the effect of the present invention is not inhibited. Also, the resinous compound may include a surfactant to improve an adhesion between the supporting substrate 1 and the resinous compound within the scope in which the object of the present invention is not limited. Also, an additive such as a polymerization inhibitor, etc. may be added if necessary.

In the stamper 3 for transferring fine pattern as described above, it is desirable that the supporting substrate 1 and the fine structure layer 2 are light-transmissive (e.g., ultraviolet light-transmissive). By such a stamper 3 for transferring fine pattern, a photo-curable resin can be used as a curable resinous material 6 (see FIG. 3) of a transferred object described below. That is, this stamper 3 for transferring fine pattern can be used as a replica mold for photo nanoimprint technology.

Figure 2A:
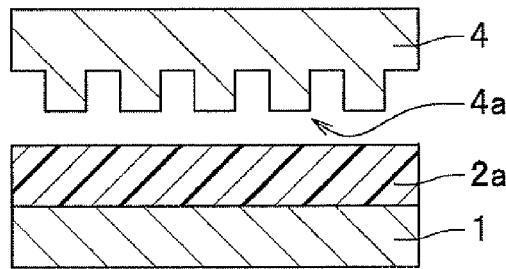
FIGS. 2A-2C are schematic views showing manufacturing process of the stamper.
Figure 2B:
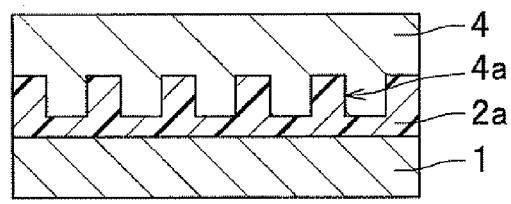
Figure 2C:
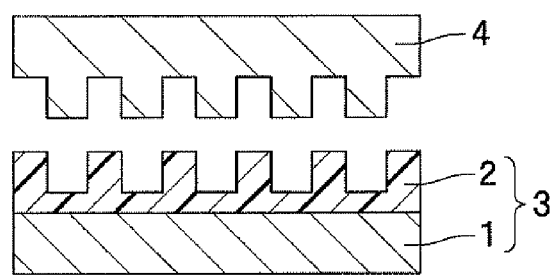

Next, a method for manufacturing the stamper 3 according to this embodiment will be explained. FIGS. 2A-2C are schematic views showing a manufacturing process of the stamper for transferring fine pattern.

First, in this manufacturing process, as shown in FIG. 2A, a master mold 4 on which a fine pattern 4a is formed is prepared. On the other hand, a resinous compound 2a whose principal component is the silsesquioxane derivative is applied on a supporting substrate 1.

Next, as shown in FIG. 2B, the master mold 4 on which the fine pattern 4a is formed is pressed against the resinous compound 2a. Also, by curing the resinous compound 2a with the master mold 4 being pressed, the fine pattern 4a of the master mold 4 is transferred to the resinous compound 2a. In this connection, curing of this resinous compound 2a may be performed by photoradiation, heating, or combination thereof.

Also, as shown in FIG. 2C, by peeling the master mold 4 from the cured resinous compound 2a (see FIG. 2B), the stamper 3 according to this embodiment, in which stamper 3 the fine structure layer 2 is formed on the supporting substrate 1, can be obtained.

Next, a method for transferring fine pattern using this stamper 3 will be explained. FIG. 3 is a schematic view showing a mechanism of transferring a fine pattern of the stamper to the transferred object.

Figure 3:
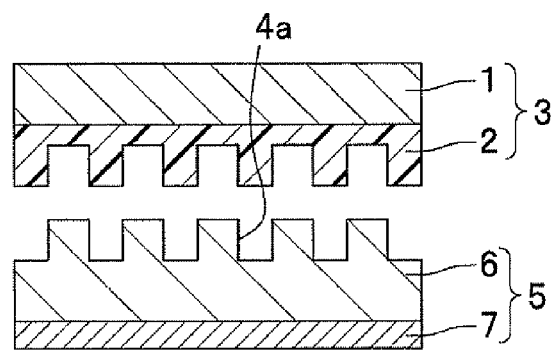
FIG. 3 is a schematic view showing a mechanism of transferring a fine pattern of the stamper to the transferred object.

In this method for transferring, as shown in FIG. 3, a transferred object 5, in which a curable resinous material 6 is disposed on a transferred substrate 7, is used.

The transferred substrate 7 is not particularly limited, and can be set depending on application of a fine structure obtained by transferring the fine pattern. More specifically, as the transferred substrate 7, for example, silicon wafers, various metallic materials, glasses, quartz, ceramics, and resins, etc. are given.

As the curable resinous material 6, for example, photo-curable resins, heat-curable resins, and thermoplastic resins, etc. are given. In addition, if at least one of the photo-curable resin and the heat-curable resin is used as the curable resinous material 6, as described above, the photo-curable resin and the heat-curable resin whose curing mechanisms differ from that of the silsesquioxane derivative which is the principal component of the resinous compound are desirable.

In this method for transferring, by pressing the stamper 3 against the curable resinous material 6 of the transferred object 5, the fine pattern 4a is transferred to the curable resinous material 6, and the fine structure can be obtained. In addition, as described above, if a light whose wavelength is 365 nanometers or more transmits through the supporting substrate 1 and fine structure layer 2 of the stamper 3, the photo-curable resin can be used as the curable resinous material 6.

As described above, in the stamper 3 according to this embodiment, because the supporting substrate 1 is disposed on the fine structure layer 2 which is made of the polymer (cured material) of the resinous compound whose main component is the silsesquioxane derivative, accurate and continuous transferring to the transferred object 5 is allowed without releasing treatment. At that time, by forming the fine structure layer 2 with a silsesquioxane derivative whose curing mechanism differs from that of the curable resinous material 6 of the transferred object 5, the mold releasing property of the stamper 3 is still improved.

In this way, the stamper 3, which improves the continuous transferring property without the releasing treatment, can reduce running costs for manufacturing the fine structure.

EMBODIMENTS

Next, the present invention will be explained more specifically with reference to the following examples. In the following explanations, units "phr (per hundred resin)" and "%" are based on weight unless otherwise stated.

Example 1

First, a silsesquioxane derivative OX-SQ SI-20 (Toagosei Limited) (1 phr) having a plurality of oxetanyl groups is mixed with an Adeka OPTOMER SP-172 (Asahi Denka Corporation) (0.06 phr) which is a cationic polymerization initiator in order to prepare a photo-curable resinous compound of a fine structure layer.

Next, a supporting substrate (20 millimeters*20 millimeters, 0.7 millimeters thick) whose surface is coupling-treated with a KBM403 (Shin-Etsu Silicones Co., Ltd.) is prepared. A resinous compound which will be a fine structure layer is dropped on the coupling-treated surface of the supporting substrate. Next, a ultraviolet light having wavelength of 365 nanometers is irradiated for 120 seconds with a quartz master mold, in which hole patterns (180 nanometers in diameter, 180 nanometers in spacing, and 200 nanometers in height) are formed on a releasing-treated surface with a OPTOOL DSX (Daikin Industries, Ltd.), being pressed against the photo-curable resinous compound. Next, the master mold is peeled from the cured photo-curable resinous compound, the fine structure layer is formed, and the stamper according to the present invention is manufactured. Using this stamper, continuous transferring is performed. A glass substrate is used for a transferred substrate, and a photo-radical polymerizable resinous compound whose principal component is an acrylate monomer is used for a transferred object. A pattern configuration of the fine structure layer is measured by an atomic force microscope (AFM) (Veeco Instruments Inc.) after 50 times transferring in order to evaluate an error compared to a pattern configuration of the fine structure layer before transferring. A maximum dimensional-error in height is on the order of 3%, and accurate and continuous transferring can be performed by the stamper without releasing treatment.

Example 2

The stamper having the fine structure layer is manufactured by a similar method to that described in Example 1. At that time, a silsesquioxane derivative Q-4OG (Toagosei Limited) (1 phr) having eight epoxy groups is mixed with the Adeka OPTOMER SP-172 (Asahi Denka Corporation) (0.06 phr) which is the cationic polymerization initiator in order to manufacture the photo-curable resinous compound of the fine structure layer. Using this photo-curable resinous compound, by the similar method to that described in Example 1, the stamper is manufactured, continuous transferring is performed, measurement is performed by AFM, and an error is evaluated. A maximum dimensional-error in height of the fine structure pattern after 50 times transferring is on the order of 3%, and accurate and continuous transferring can be performed by the stamper without releasing treatment.

Example 3

The stamper having the fine structure layer is manufactured by a similar method to that described in Example 1. At that time, a silsesquioxane derivative Tris[(epoxypropoxypropyl) dimethylsilyloxy]-POSS (ALDRICH) (1 phr) having three cationic polymerizable epoxy groups is mixed with the Adeka OPTOMER SP-172 (Asahi Denka Corporation) (0.06 phr) which is the photo-cationic polymerization initiator in order to manufacture the photo-curable resinous compound. Using this photo-curable resinous compound, by the similar method to that described in Example 1, the resinous stamper is manufactured, continuous transferring is performed, measurement is performed by AFM, and an error is evaluated. A maximum dimensional-error in height of the fine structure pattern after 50 times transferring is on the order of 3%, and accurate and continuous transferring can be performed by the stamper without releasing treatment.

Example 4

The stamper having the fine structure layer is manufactured by a similar method to that described in Example 1. At that time, a silsesquioxane derivative (90 phr) having eight photo-cationic polymerizable epoxy groups is mixed with a polydimethylsiloxane (10 phr) having the same two photo-cationic polymerizable epoxy groups and the Adeka OPTOMER SP-172 (Asahi Denka Corporation) (6 phr) which is the photo-cationic polymerization initiator in order to manufacture the photo-curable resinous compound. Using this photo-curable resinous compound, by the similar method to that described in Example 1, the stamper is manufactured, continuous transferring is performed, measurement is performed by AFM, and an error is evaluated. A maximum dimensional-error in height of the fine structure pattern after 50 times transferring is on the order of 3%, and accurate and continuous transferring can be performed by the stamper without releasing treatment.

Example 5

The stamper having the fine structure layer is manufactured by a similar method to that described in Example 1. At that time, a silsesquioxane derivative (90 phr) having eight photo-cationic polymerizable epoxy groups is mixed with a Epicoat 828 (Japan Epoxy Resins Co., Ltd.) (10 phr) which has the same photo-cationic polymerizable epoxy groups and is a bisphenol A epoxy resin, and the Adeka OPTOMER SP-172 (Asahi Denka Corporation) (6 phr) which is the photo-cationic polymerization initiator in order to manufacture the photo-curable resinous compound. Using this photo-curable resinous compound, by the similar method to that described in Example 1, the stamper is manufactured, continuous transferring is performed, measurement is performed by AFM, and an error is evaluated. A maximum dimensional-error in height of the fine structure pattern after 50 times transferring is on the order of 3%, and accurate and continuous transferring can be performed by the stamper without releasing treatment.

Example 6

A silsesquioxane derivative OX-SQ SI-20 (Toagosei Limited) (1 phr) having a plurality of oxetanyl groups is mixed with the Adeka OPTOMER SP-172 (Asahi Denka Corporation) (0.06 phr) which is the cationic polymerization initiator in order to manufacture the photo-curable resinous compound of the fine structure layer. Also, the supporting substrate (20 millimeters*20 millimeters, 0.7 millimeters thick) whose surface is coupling-treated with a KBM403 (Shin-Etsu Silicones Co., Ltd.) is prepared. The resinous compound which will be the fine structure layer is dropped on the quartz master mold in which hole patterns (180 nanometers in diameter, 180 nanometers in spacing, and 200 nanometers in height) are formed on the releasing-treated surface with the OPTOOL DSX (Daikin Industries, Ltd.). After spin coating, the ultraviolet light is irradiated in order to form the fine structure layer.

Next, after pressing a coupling-treated high elastic supporting substrate which will be a first supporting layer (a second hard layer), the ultraviolet light is irradiated in order to form the first supporting layer. A low elastic epoxy resin, which will be a second supporting layer (soft layer), has a different elastic coefficient from that of the resin used for the fine structure layer, and is dropped. After spin coating, the ultraviolet light is irradiated in order to form the second supporting layer. After pressing the coupling-treated high elastic supporting substrate which will be a third supporting layer (a first hard layer), the ultraviolet light is irradiated in order to form the third supporting layer. As a result, the supporting substrate composed of the first supporting layer, the second supporting layer and the third supporting layer is formed.

Next, the fine structure layer, the first supporting layer, the second supporting layer, and the third supporting layer, which are made of cured photo-curable resinous compounds, are peeled from the master mold in order to manufacture the stamper according to the present invention. Using the manufactured stamper, continuous transferring is performed. A glass substrate is used for a transferred substrate, and a photo-radical polymerizable resinous compound whose principal component is an acrylate monomer is used for a transferred object. A pattern configuration of the fine structure layer is measured by an atomic force microscope (AFM) (Veeco Instruments Inc.) after 50 times transferring in order to evaluate an error compared to a pattern configuration of the fine structure layer before transferring. A maximum dimensional-error in height is on the order of 3%, and accurate and continuous transferring can be performed by the stamper without releasing treatment.

Example 7

A silsesquioxane derivative OX-SQ SI-20 (Toagosei Limited) (1 phr) having a plurality of oxetanyl groups is mixed with the Adeka OPTOMER SP-172 (Asahi Denka Corporation) (0.06 phr) which is the cationic polymerization initiator in order to manufacture the photo-curable resinous compound of the fine structure layer. Also, the supporting substrate (20 millimeters*20 millimeters, 0.7 millimeters thick) whose surface is coupling-treated with a KBM403 (Shin-Etsu Silicones Co., Ltd.) is prepared. The resinous compound which will be the fine structure layer is dropped on the quartz master mold in which hole patterns (180 nanometers in diameter, 180 nanometers in spacing, and 200 nanometers in height) are formed on the releasing-treated surface with the OPTOOL DSX (Daikin Industries, Ltd.). After spin coating, the ultraviolet light is irradiated in order to form the fine structure layer.

Next, a low elastic epoxy resin, which will be a first supporting layer (second soft layer), has a different elastic coefficient from that of the resin used for the fine structure layer, and is dropped. After spin coating, the ultraviolet light is irradiated in order to form the first supporting layer. After pressing the coupling-treated high elastic supporting substrate which will be a second supporting layer (a second hard layer), the ultraviolet light is irradiated in order to form the second supporting layer. Next, a unsaturated polyester resin which will be a third supporting layer (a first soft layer) is dropped. After spin coating, the ultraviolet light is irradiated in order to form the third supporting layer. Next, after pressing the coupling-treated high elastic supporting substrate which will be a fourth supporting layer (a first hard layer), the ultraviolet light is irradiated in order to form the fourth supporting layer.

Next, the fine structure layer, the first supporting layer, the second supporting layer, the third supporting layer, and the fourth supporting layer, which are made of cured photo-curable resinous compounds, are peeled from the master mold in order to manufacture the stamper according to the present invention. Using the manufactured stamper, continuous transferring is performed. A glass substrate is used for a transferred substrate, and a photo-radical polymerizable resinous compound whose principal component is an acrylate monomer is used for a transferred object. A pattern configuration of the fine structure layer is measured by an atomic force microscope (AFM) (Veeco Instruments Inc.) after 50 times transferring in order to evaluate an error compared to a pattern configuration of the fine structure layer before transferring. A maximum dimensional-error in height is on the order of 2%, and accurate and continuous transferring can be performed by the stamper without releasing treatment.

Example 8

A silsesquioxane derivative OX-SQ SI-20 (Toagosei Limited) (1 phr) having a plurality of oxetanyl groups is mixed with the Adeka OPTOMER SP-172 (Asahi Denka Corporation) (0.06 phr) which is the cationic polymerization initiator in order to manufacture the photo-curable resinous compound of the fine structure layer. Also, the supporting substrate (20 millimeters*20 millimeters, 0.7 millimeters thick) whose surface is coupling-treated with a KBM403 (Shin-Etsu Silicones Co., Ltd.) is prepared. The resinous compound which will be the fine structure layer is dropped on the quartz master mold in which hole patterns (180 nanometers in diameter, 180 nanometers in spacing, and 200 nanometers in height) are formed on the releasing-treated surface with the OPTOOL DSX (Daikin Industries, Ltd.). After spin coating, the ultraviolet light is irradiated in order to form the fine structure layer.

Next, a low elastic epoxy resin, which will be a first supporting layer (a soft layer), has a different elastic coefficient from that of the resin used for the fine structure layer, is dropped. After pressing a coupling-treated high elastic supporting substrate which will be a second supporting layer (a hard layer), the ultraviolet light is irradiated in order to form the supporting substrate composed of the first supporting layer, and second supporting layer.

Next, the first supporting layer, the second supporting layer, and the fine structure layer, which are made of cured photo-curable resinous compounds, are peeled from the master mold in order to manufacture the stamper according to the present invention. Using the manufactured stamper, continuous transferring is performed. A glass substrate is used for a transferred substrate, and a photo-radical polymerizable resinous compound whose principal component is an acrylate monomer is used for a transferred object. A pattern configuration of the fine structure layer is measured by an atomic force microscope (AFM) (Veeco Instruments Inc.) after 50 times transferring in order to evaluate an error compared to a pattern configuration of the fine structure layer before transferring. A maximum dimensional-error in height is on the order of 3%, and accurate and continuous transferring can be performed by the stamper without releasing treatment.

Comparative Example 1

The stamper having the fine structure layer is manufactured by a similar method to that described in Example 1. At that time, a silsesquioxane derivative (1 phr) having eight radical polymerizable acrylate groups is mixed with a DAROCURE 1173 (Ciba Specialty Chemicals) (0.03 phr) which is the photo-radical polymerization initiator in order to manufacture the photo-curable resinous compound. Although a continuous transferring property is evaluated by a similar method to that described in Example 1, the fine structure can not be transferred because the stamper can not be peeled from the transferred object.

Comparative Example 2

The stamper having the fine structure layer is manufactured by a similar method to that described in Example 1. At that time, a bifunctional polydimethylsiloxane is mixed with the Adeka OPTOMER SP-172 (Asahi Denka Corporation) which is the photo-cationic polymerization initiator as the cationic polymerization initiator in order to manufacture a photo-curable resinous compound of a pattern layer. Although a continuous transferring property is evaluated by a similar method to that described in Example 1, a transferring of the fine structure to the transferred object can not be confirmed at 20 times continuous transferring. At the same time, after 20 times continuous transferring, a broken pattern in the fine structure layer of the stamper is observed. Also, with the 10 times transferred object, an accurate transferring can not be performed because a pattern height is increased by 10-20% compared to the transferred object which is not transferred yet.

Comparative Example 3

The stamper having the fine structure layer is manufactured by a similar method to that described in Example 1. At that time, a silsesquioxane derivative (7.5 phr) having eight photo-cationic polymerizable epoxy groups is mixed with a poly-dimethylsiloxane (25 phr) having the same two photo-cationic polymerizable epoxy groups and the Adeka OPTOMER SP-172 (Asahi Denka Corporation) (6 phr) which is the photo-cationic polymerization initiator in order to manufacture the photo-curable resinous compound. Although a continuous transferring property is evaluated by a similar method to that described in Example 1, a transferring of the fine structure to the transferred object can not be confirmed at 20 times continuous transferring. At the same time, after 20 times continuous transferring, a pattern buckling in the fine structure layer of the stamper is observed. Also, with the 10 times transferred object, an accurate transferring can not be performed because a pattern height is increased by 10-20% compared to the transferred object which is not transferred yet. Further, widespread transferring failures are confirmed, and the fine structure layer is broken after continuous transferring 10 times or so.

Comparative Example 4

The stamper having the fine structure layer is manufactured by a similar method to that described in Example 1. At that time, a silsesquioxane derivative (7.5 phr) having eight photo-cationic polymerizable epoxy groups is mixed with the Epi-coat 828 (Japan Epoxy Resins Co., Ltd.) (25 phr) which is a bisphenol A epoxy resin having the same two photo-cationic polymerizable epoxy groups and the Adeka OPTOMER SP-172 (Asahi Denka Corporation) (6 phr) which is the photo-cationic polymerization initiator in order to manufacture the photo-curable resinous compound. Although a continuous transferring property is evaluated by a similar method to that described in Example 1, a transferring of the fine structure to the transferred object can not be confirmed at 20 times continuous transferring. At the same time, after 20 times continuous transferring, a pattern buckling in the fine structure layer of the stamper is observed. Also, with the 10 times transferred object, an accurate transferring can not be performed because a pattern height is increased by 10-20% compared to the transferred object which is not transferred yet. Further, transferring failures are confirmed over a wide range, and the fine structure layer is broken after continuous transferring 10 times or so.

What is claimed is:

1. A pattern transferring method for transferring a concave-convex pattern on a stamper to a photo-curable resin material, the method comprising the steps of
pressing the stamper onto a photo-curable resin material of a transfer substrate, the stamper having a fine structure layer on which a fine concavo-convex pattern is formed, and
curing the photo-curable resin material,
wherein
the fine structure layer of the stamper is made of a polymer of a resin compound whose principal component is a silsesquioxane derivative material to be cured on a mechanism different from a mechanism on which the photo-curable resin material is cured, wherein the fine structure layer is a polymer of a resin compound whose principal component is silsesquioxane derivative having a plurality of polymerizable functional groups.

2. The pattern transferring method according to claim 1, wherein the silsesquioxane derivative is photo-cationic polymerizable while the photo-curable resin material is photo-radical polymerizable.

3. The pattern transferring method according to claim 2, wherein the photo-curable resin material is a photo-radical polymerizable resin compound whose principal component is an acrylate monomer.

4. The pattern transferring method according to claim 1, wherein the silsesquioxane derivative is photo-radical polymerizable while the photo-curable resin material is photo-cationic polymerizable.

5. The pattern transferring method according to claim 1, wherein a surface of the stamper is not subjected to a mold releasing treatment.

6. The pattern transferring method according to claim 1, wherein the silsesquioxane derivative content of the resin compound is preferably 80 weight percent or more.

7. The pattern transferring method according to claim 6, wherein the resin compound whose principal component is the silsesquioxane derivative may be a resinous monomer having a same polymerizable functional group as that of the silsesquioxane derivative other than the silsesquioxane derivative.

8. The pattern transferring method according to claim 1, wherein the stamper having a fine structure layer on which a fine concavo-convex pattern is produced by a process comprising the steps of:
 applying a resinous compound, a principal component of which is the silsesquioxane derivative, on a supporting substrate;
 pressing a master mold on which a fine pattern against the resinous compound;
 curing the resinous compound on the supporting substrate while the master mold is being pressed; and
 peeling the master mold from the cured resinous compound.

\* \* \* \* \*